(12) United States Patent
Taminger et al.

(10) Patent No.: US 8,452,073 B2
(45) Date of Patent: May 28, 2013

(54) CLOSED-LOOP PROCESS CONTROL FOR ELECTRON BEAM FREEFORM FABRICATION AND DEPOSITION PROCESSES

(75) Inventors: Karen M. Taminger, Yorktown, VA (US); Robert A. Hafley, Yorktown, VA (US); Richard E. Martin, Yorktown, VA (US); William H. Hofmeister, Nashville, TN (US)

(73) Assignee: The United States of America as represented by the Administrator of the National Aeronautics and Space Administration, Washington, DC (US)

( * ) Notice: Subject to any disclaimer, the term of this patent is extended or adjusted under 35 U.S.C. 154(b) by 550 days.

(21) Appl. No.: 12/750,991

(22) Filed: Mar. 31, 2010

(65) Prior Publication Data

US 2010/0260410 A1 Oct. 14, 2010

Related U.S. Application Data

(60) Provisional application No. 61/167,540, filed on Apr. 8, 2009.

(51) Int. Cl.
*G06K 9/00* (2006.01)
(52) U.S. Cl.
USPC .. 382/141; 218/136; 219/121.15; 219/121.63
(58) Field of Classification Search
USPC ............ 382/141–151; 218/137 R, 136; 219/121.15–121.17, 121.63–121.65; 700/108, 700/119
See application file for complete search history.

(56) References Cited

U.S. PATENT DOCUMENTS

| | | | |
|---|---|---|---|
| 4,900,695 | A | 2/1990 | Takahashi et al. |
| 5,994,659 | A | 11/1999 | Offer |
| 6,046,426 | A | 4/2000 | Jeantette et al. |
| 6,143,378 | A | 11/2000 | Harwell et al. |
| 6,405,095 | B1 | 6/2002 | Jang et al. |
| 6,476,343 | B2 | 11/2002 | Keicher et al. |
| 6,509,568 | B1 | 1/2003 | Ooae et al. |
| 6,593,008 | B2 | 7/2003 | Schmidt |
| 6,667,486 | B2 | 12/2003 | Ohta et al. |
| 6,710,296 | B2 | 3/2004 | Siedal |

(Continued)

OTHER PUBLICATIONS

William H. Hofmeister, Robert A. Hafley, Karen M. Taminger, Kim S. Bey, Thermal imaging and control of electron beam freeform fabrication (ebf3) Presented at MS&T '05 on Sep. 27, 2005.

*Primary Examiner* — Gregory J Toatley
*Assistant Examiner* — Iyabo S Alli
(74) *Attorney, Agent, or Firm* — Jennifer L. Riley; Robin W. Edwards

(57) ABSTRACT

A closed-loop control method for an electron beam freeform fabrication (EBF$^3$) process includes detecting a feature of interest during the process using a sensor(s), continuously evaluating the feature of interest to determine, in real time, a change occurring therein, and automatically modifying control parameters to control the EBF$^3$ process. An apparatus provides closed-loop control method of the process, and includes an electron gun for generating an electron beam, a wire feeder for feeding a wire toward a substrate, wherein the wire is melted and progressively deposited in layers onto the substrate, a sensor(s), and a host machine. The sensor(s) measure the feature of interest during the process, and the host machine continuously evaluates the feature of interest to determine, in real time, a change occurring therein. The host machine automatically modifies control parameters to the EBF$^3$ apparatus to control the EBF$^3$ process in a closed-loop manner.

23 Claims, 2 Drawing Sheets

U.S. PATENT DOCUMENTS

| | | |
|---|---|---|
| 6,727,459 B1 | 4/2004 | Bialach |
| 6,813,533 B1 | 11/2004 | Semak |
| 6,943,507 B2 | 9/2005 | Winkler et al. |
| 6,995,334 B1 * | 2/2006 | Kovacevic et al. ............ 700/166 |
| 7,168,935 B1 * | 1/2007 | Taminger et al. ........ 219/121.16 |
| 2003/0231304 A1 | 12/2003 | Chan et al. |

\* cited by examiner

CLOSED-LOOP PROCESS CONTROL FOR ELECTRON BEAM FREEFORM FABRICATION AND DEPOSITION PROCESSES

ORIGIN OF THE INVENTION

This invention was made in part by employees of the United States Government and may be manufactured and used by or for the Government of the United States of America for governmental purposes without the payment of any royalties thereon or therefor.

CROSS-REFERENCE TO RELATED APPLICATIONS

This application claims priority to and the benefit of U.S. Provisional Application No. 61/167,540, filed on Apr. 8, 2009, which is hereby incorporated by reference in its entirety. In addition, this application is co-pending with the related application entitled "USE OF BEAM DEFLECTION TO CONTROL AN ELECTRON BEAM WIRE DEPOSITION PROCESS," U.S. application Ser. No. 12/751,075, filed on the same day and owned by the same assignee as this application, the contents of which are incorporated herein by reference in their entirety.

TECHNICAL FIELD

The present invention relates to a method and an apparatus for closed-loop process control in electron beam freeform fabrication and deposition processes.

BACKGROUND OF THE INVENTION

Electron beam freeform fabrication ($EBF^3$) is an emerging manufacturing deposition process in which an electron beam is used in conjunction with a wire feed to progressively deposit material onto a substrate in a layered manner. The electron beam is translated with respect to a surface of the substrate while the wire is melted and fed into a molten pool. In an $EBF^3$ process, a design drawing of a three-dimensional (3D) object may be sliced into different layers as a preparatory step, with the electron beam tracing each of the various layers within a vacuum chamber. The layers ultimately cool into a desired complex or 3D shape.

Currently, $EBF^3$ processing uses limited closed-loop motor control on each of the individual positioning, electron beam, and wire feeder axes to ensure that each axis is driving to the requested value, e.g., when a signal of "move X axis 4.000 inches at a speed of 10.0 inches/min" is sent to a motor driver, a feedback loop tracks the speed and location to verify that motion occurs as programmed. However, real-time sensing or feedback is lacking on the actual deposition process. Anomalies are common, e.g., changing chemistry of the resulting deposit, wire position control, gradual increase in temperature affecting the size and shape of the molten pool and resulting deposit, over or under build of a target height due to an improperly programmed height, etc. Therefore, process reproducibility issues may result, along with difficulty in certifying $EBF^3$-fabricated components.

SUMMARY OF THE INVENTION

Accordingly, a closed-loop control method and apparatus are set forth herein for an electron beam freeform fabrication ($EBF^3$) process. The method, which may be embodied as one or more algorithms and executed via a host machine of the apparatus set forth herein, uses a sensor or multiple sensors to automatically detect or measure features of interest in the $EBF^3$ process, e.g., by imaging the molten pool during the $EBF^3$ process via cameras, thermal sensors, and/or other suitable means. Sensor data describing the features of interest is fed into the host machine, which evaluates the sensor data to detect a magnitude/degree and/or a rate of change in the features of interest. The algorithm generates a feedback signal which is used by the host machine to modify a set of input parameters to the $EBF^3$ process. Execution of the algorithm (s) thus modifies and/or maintains consistency of the $EBF^3$ process.

In particular, a closed-loop control method is provided herein for an $EBF^3$ process wherein a wire is melted and progressively deposited in layers onto a suitable substrate to form a complex product. The method includes detecting or measuring a feature of interest of the molten pool during the $EBF^3$ process using at least one sensor, continuously evaluating the feature of interest to determine, in real time, a change occurring therein, and automatically modifying a set of input parameters to the $EBF^3$ process to thereby control the $EBF^3$ process.

An apparatus provides closed-loop control of the $EBF^3$ process, with the apparatus including an electron gun adapted for generating an electron beam, and a wire feeder for feeding a wire toward a substrate where the wire, once melted into a molten pool by the beam, is progressively deposited in layers onto the substrate. The apparatus also includes a host machine and at least one sensor. The sensor(s) are adapted for detecting or measuring a feature of interest of a molten pool formed during the $EBF^3$ process, and the host machine executes an algorithm(s) to continuously evaluate the feature of interest and determine, in real time, a change occurring therein. The host machine automatically modifies a set of input parameters to the $EBF^3$ process, i.e., by signaling a main process controller to change one or more of these parameters, to thereby control the $EBF^3$ process in a closed-loop manner.

The above features and advantages and other features and advantages of the present invention are readily apparent from the following detailed description of the best modes for carrying out the invention when taken in connection with the accompanying drawings.

DESCRIPTION OF THE PREFERRED EMBODIMENTS

Figure 1:
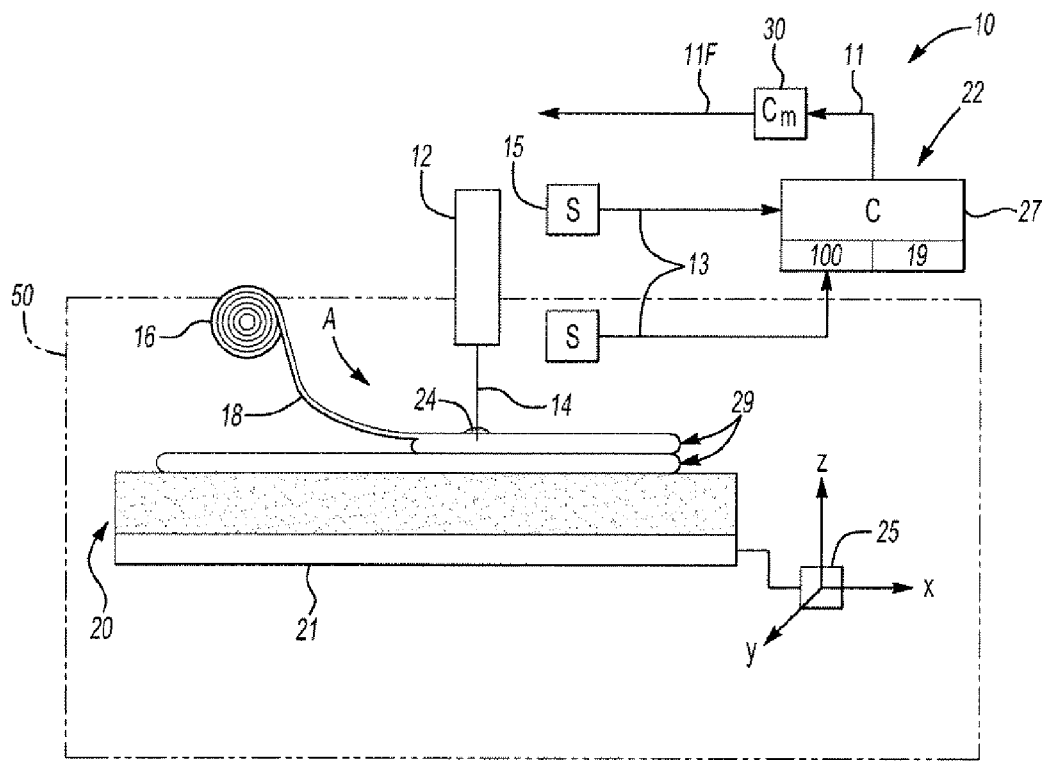
FIG. 1 is a schematic illustration of an electron beam freeform fabrication ($EBF^3$) apparatus having closed-loop control capability in accordance with the invention.

Referring to the drawings wherein like reference numbers represent like components throughout the several figures, and beginning with FIG. 1, an apparatus 10 is configured for use in an electron beam freeform fabrication process, hereinafter abbreviated as $EBF^3$ for simplicity. An example of an $EBF^3$ process to which the present invention could be applied is described and claimed in U.S. Pat. No. 7,168,935. As will be understood by those of ordinary skill in the art, an EBF³ process allows a complex object, e.g., a vehicle, aircraft, or spacecraft component, to be formed in a progressive or layered manner using an electron beam 14.

The apparatus 10 is used with an EBF³ process, and includes an electron beam gun 12 contained in a sealed container or vacuum chamber 50 capable of maintaining a vacuum environment. The gun 12, part of which may be positioned outside of the chamber 50 for access and electrical connectivity, is adapted to generate and transmit an electron beam 14 within the vacuum environment, and to direct the beam toward a substrate 20. In the embodiment of FIG. 1, the substrate 20 is positioned on a moveable platform 21. Alternately, the gun 12 may be completely enclosed within chamber 50 so that the gun is also moved rather than just the substrate 20. In either embodiment, the gun 12 moves relative to the substrate 20.

The platform 21 and/or the gun 12 may be movable via a multi-axis positioning drive system 25, which is shown schematically as a box in FIG. 1 for simplicity. A complex or three-dimensional (3D) object is formed by progressively forming and cooling a molten pool 24 into layers 29 on the substrate 20. Molten pool 24 is formed by beam-melting of consumable wire 18, e.g., a suitable metal such as aluminum or titanium, which is fed toward the molten pool from a wire feeder 16, e.g., a spool or other suitable delivery mechanism having a controllable speed. While not shown in FIG. 1 for simplicity, chamber 50 may be evacuated using a vacuum subsystem, e.g., a turbo-molecular pump, a scroll pump, an ion pump, ducts, valves, etc., as understood in the art.

The apparatus 10 also includes a closed-loop controller (C) 22 having a host machine 27 and an algorithm(s) 100 adapted for controlling an EBF³ process conducted using the apparatus. Controller 22 is electrically connected to or in communication with a main process controller ($C_m$) 30 which, as understood in the art, is adapted for sending necessary commands to the gun 12, the wire feeder 16, and any required motors (not shown) that position the substrate 20 and the gun, including a set of final control parameters 11F. The controller 22 generates and transmits a set of input parameters 11 that modifies the final control parameters 11F as set forth below.

The wire 18, when melted by the electron beam 14, e.g., to over approximately 3000° F. in one embodiment, is accurately and progressively deposited, layer upon layer, according to a set of design data 19, e.g., Computer Aided Design (CAD) data or another 3D design file. In this manner, a 3D structural part or other complex object may be created in an additive manner without the need for a casting die or mold. Rapid prototyping and hands-free manufacturing of vehicle, airplane, spacecraft, and/or other complex components or parts is thus enabled.

Still referring to FIG. 1, the present invention provides a closed-loop control methodology for use with an EBF³ process. While some closed-loop processes are used for laser deposition processes using direct metal powder feed, these methods are not germane to the EBF³ process for several reasons. First, the physics of interactions between the different energy sources, i.e., a laser beam versus an electron beam, and the consumable metal itself are sufficiently different that any controls associated with a laser heat source are not readily applicable to a process using an electron beam heat source. Second, an EBF³ process occurs in a vacuum, as noted above, with some metal vapor evolving off of the molten pool 24. Vacuum is a much harsher environment than the inert gas environment used with laser-based deposition processes. This alters the type and effectiveness of the sensors that may be integrated into a closed-loop control system of the type set forth herein. Third, the use of wire 18 instead of powder as a feedstock material enables different control schemes, thus affecting the mass flow rate of the input material instantaneously. Fourth, the electron beam 14 can be automatically modulated, i.e., focused and rastered at extremely high (kHz) rates, enabling a greater range of beam controls than are possible using lasers.

Therefore, in order to achieve closed-loop EBF³ process control, the closed-loop controller 22 of FIG. 1 may be electrically connected to one or more sensors (S) 15 to detect or measure one or more specific features of interest of the molten pool 24, with the information describing the feature(s) of interest relayed to the controller 22 as a set of sensor data 13. Host machine 27 receives the sensor data 13 and runs one or more algorithms, represented collectively as the algorithm 100 in FIGS. 1 and 2, to interpret the sensor data. The controller 22 signals the main process controller 30 to modify the final control parameters 11F for the EBF³ process as needed. For example, the controller 22 may signal the main controller 30 to alter a feed rate of the wire feeder 16, a power value of the gun 12, a speed of the moveable platform 21, and/or any other components of the apparatus 10.

Host machine 27 may be adapted as a high-end desktop computer equipped with a basic data acquisition and analysis software environment, e.g., LabView® software, and high speed data acquisition boards for real-time acquisition and analysis of large volumes of data associated with high speed data images. The host machine 27 may include sufficient read only memory (ROM), random access memory (RAM), electrically-erasable programmable read only memory (EEPROM), etc., of a size and speed sufficient for executing the algorithm 100 as set forth below. The host machine 27 can also be configured or equipped with other required computer hardware, such as a high speed clock, requisite analog-to-digital (A/D) and digital-to-analog (D/A) circuitry, any necessary input/output circuitry and devices (I/O), as well as appropriate signal conditioning and/or buffer circuitry. Any algorithms resident in the host machine 27 or accessible thereby, including the algorithm 100 as described below, can be stored in memory and automatically executed to provide the respective functionality.

Algorithm 100, which may be embodied as a single algorithm or multiple algorithms without departing from the intended scope of the invention, is automatically executed by the host machine 27 to interpret the sensor data 13, and to assess the magnitude and speed of any changes occurring during the EBF³ process. An understanding of the EBF³ process identifies an appropriate response and any input parameters, transmitted as the set of input parameters 11, requiring modification in order to maintain process consistency. A closed feedback loop is formed between the controller 22, working with the main process controller 30 and the controlled EBF³ system components, e.g., the gun 12, wire feeder 16, etc., to allow for a real-time modification to the final control parameters 11F. Each of these components is described below.

The features of interest to be monitored during the EBF³ process are linked to the various sensors 15. In one embodiment, multiple sensors 15 may be integrated into the apparatus 10, and operated independently or in combination depending on the particular application. Sensors 15 may include, by way of example, a charge-coupled device (CCD)-equipped camera adapted to convert an image of the process region (arrow A) into a digital signal suitable for processing by the host machine 27. Sensors 15 may also include a Complementary Metal-Oxide Semiconductor (CMOS)-based camera used to visually monitor the EBF³ process with relatively low noise/low power consumption. Sensors 15 may use a CCD-equipped camera in conjunction with an infrared (IR) band-pass filter(s) to thermally image the EBF$^3$ process. A secondary electron detector may also be used as or with one of the sensors 15 to further visually monitor the EBF$^3$ process.

As shown in FIG. 1, at least one of the sensors 15 may be mounted outside of the vacuum chamber 50, e.g., when a fixed-gun system is used. As will be understood by those of ordinary skill in the art, in a fixed-gun system all motion occurs on the deposited part such that the deposition process always occurs in the same spot, thereby enabling installation of a sensor 15 in the form of a fixed camera at a position outside of the vacuum chamber 50. A sensor 15 configured and positioned as described may be used to monitor, for example, a height of any deposited material or bead of the molten pool 24, and/or a distance between the molten pool and the wire feeder 16.

Sensors 15 equipped as digital cameras having CCD capability may be installed in several different orientations inside the vacuum chamber 50, and focused on the process zone as indicated by arrow A. A CMOS-equipped camera may be installed outside of the vacuum chamber of gun 12, and a fiber optic cable (not shown) or other communications conduit may be used to transmit images from within the vacuum chamber to the CMOS camera. These cameras may be used to image bead shape and height during formation of the molten pool 24, a location of the wire 18 relative to the molten pool, and melt pool shape and area as determined by examining the change in reflectance between the molten and solid material.

IR band-pass filters may also be installed on sensors 15 configured as CCD-equipped or CMOS-equipped digital cameras in order to examine a temperature of the molten pool 24 and the surrounding region. A secondary electron detector as noted above may be installed and adapted to use electrons from the electron beam 14 to image the EBF$^3$ process in real-time. Electrons reflected off wire 18 and the molten pool 24 may be pulled into a sensor 15 adapted as such a secondary electron detector to provide an image of anything that the incident electron beam encounters. A raster pattern of the electron beam 14 can be automatically modified to expand the imaging field.

Figure 2:
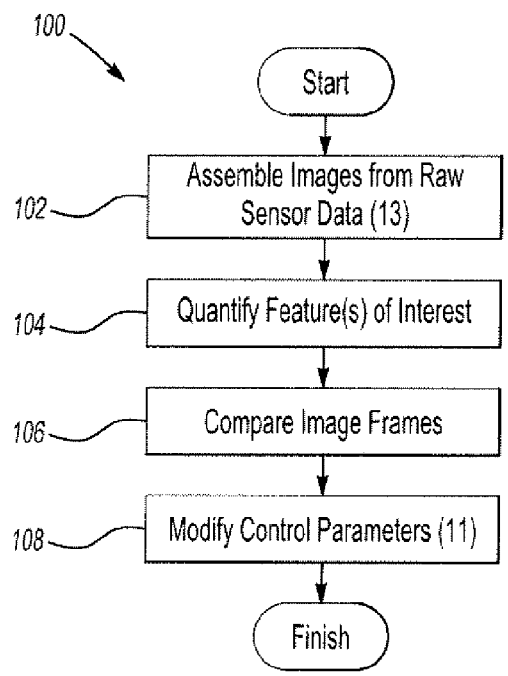
FIG. 2 is a flow chart describing a closed-loop control method usable with the $EBF^3$ apparatus of FIG. 1.

Referring to FIG. 2, algorithm 100 is automatically executed by the host machine 27 to enable closed loop control of the EBF$^3$ process as set forth herein. At step 102, the algorithm 100 takes the raw data from the set of sensor data 13 and assembles it into interpretable images. The configuration of the sensors 15 collecting the sensor data 13 dictates the level of sophistication required in this step. Use of cameras simplifies step 102 because the sensor data 13 is already provided in an interpretable form of an image. A sensor 15 in the form of a scanning electron beam detector adds complexity, particularly since rastering of the electron beam 14 is primarily for putting energy into the desired locations within the EBF$^3$ process, as dictated by process understanding.

Once the raw sensor data 13 has been converted into an interpretable image at step 102, the algorithm 100 proceeds to step 104 and quantifies the specific feature of interest being monitored for closed-loop control. The features monitored depend somewhat upon the specific sensors selected and the primary basis of the control loop, such as maintaining consistent thermal input, consistent deposit geometry, and the ability to detect flaws by monitoring the process. All features of interest may need to be monitored and controlled to some extent. Depending upon the final application and use of the EBF$^3$ process, some of these features become more important than others.

At step 104, the algorithm 100 deconvolutes the overall image into a measurable feature. For example, to maintain consistent thermal input, the area and shape of the molten pool 24 may be monitored during the EBF$^3$ process. The area of the molten pool 24 may be measured by counting the number of pixels of the same intensity associated with the molten phase. The shape of the molten pool 24 can be described by its aspect ratio, i.e. length to width, which may be easily determined by comparing the maximum number of pixels measured in each of two orthogonal directions. The area and shape can be measured by a top-view camera or an angle-view camera looking down upon the molten pool 24. The angle itself does not matter, as long as it is constant or measured so that geometric corrections can be applied to the image as the camera angle changes.

Still within step 104, as heat builds up within the substrate 20 from subsequent deposition layers, the molten pool 24 will increase in width and length. A threshold may be established for these two parameters, and when either the area or the aspect ratio of the molten pool exceeds the threshold, a command action may be triggered. A sensor 15 in the form of a side-view optical camera may be used to monitor the height of a deposited bead on substrate 20, and the distance between the deposited bead and the wire feeder 16. In such an embodiment, cross-hairs may be superimposed over the optical image, with the z-height of the deposit adjusted up or down to maintain the height of the current deposited layer centered on the cross-hairs. This approach may help to maintain consistent deposition distance and eliminate wire sticks and drips associated with incorrect standoff distance between the wire feeder 16 and the deposit, as understood in the art.

At step 106, image frames collected in earlier steps are compared to monitor the magnitude and rate of change occurring with that particular feature of interest, in order to determine and export appropriate modifications to the set of input parameters 11. Step 106 is based upon the understanding of the effects of any changes of the parameters 11F on the EBF$^3$ process. For example, the bead height decreases as the temperature or input power increases because the molten pool 24 spreads. The bead height also decreases slightly as translation speed is increased because the total thermal input is spread over more area, and because there is less mass flow of the molten pool 24 unless the wire feed rate is also changed in conjunction with the translation speed changes.

Wire feed rate has a particularly significant impact on bead height. As more wire is fed, i.e., an increase is provided in the mass flow rate of new material into the EBF$^3$ process, the bead height increases proportionally. By comparing image frames, algorithm 100 therefore determines which of the final control parameters 11F to modify based upon the quantified process independent/dependent variable relationships. Once determined, algorithm 100 proceeds to step 108.

At step 108, the host machine 27 sends the set of input parameters 11, i.e., the required modifications, to the main process controller 30 to maintain the feature of interest, measured and quantified at step 104, within an acceptable range. This occurs in near real-time within the limits of the physical thermodynamics controlling the EBF$^3$ process. The process understanding required for step 108 first defines the overall philosophy for the closed-loop control, and then identifies the appropriate features of interest to be monitored to attain that control philosophy. Appropriate independent/dependent variable relationships provide the appropriate modifications to the set of input parameters 11 to attain optimum process control.

Depending upon the end use of the parts fabricated via EBF$^3$, e.g., complex or 3D vehicle, aircraft, or spacecraft parts, different control philosophies may be more important to some industries relative to others. However, some level of control is required to maintain consistency from the bottom of the deposit to the top, from one part to the next built on a specific machine, from one material to another, and from one machine and operator to the next. Such control enables a certifiable process that can be employed to fabricate a variety of parts from different materials for many different industrial sectors.

Process Control Philosophy:

Referring again to FIG. 1, the primary goal of EBF³ is to deposit wire 18 onto the substrate 20 in a precise manner. The intense heat from the electron beam 14 must be partitioned between melting the wire 18 and maintaining a shallow molten pool 24 on the substrate 20 to ensure good adherence of the molten deposit to the substrate. Excess thermal input causes many of the problems described above, such as greater preferential loss of alloying additions due to differences in vapor pressure for different elements, thermal residual stresses and distortion, and grain growth due to excess heat. Maintaining a consistent thermal input becomes important in order to mitigate those problems introduced by a point source of heat on the substrate 20.

Since the EBF³ process is capable of fabricating complex geometries that are not fabricable using conventional means, it is important to be able to maintain precise geometry. A basic level of height control is also required to maintain a flawless process. If the wire-to-workpiece distance varies too much, flaws such as wire sticking into the molten pool 24 or drips from the end of the wire 18 will cause an uneven surface and underlying flaws to develop. Without modifications by the set of input parameters 11 from controller 22 to the set of final control parameters 11F from the main process controller 30 to maintain an even height, the additive nature of the process may exacerbate surface height flaws until the height differential is too large to be able to sustain the process.

Complex programmed positioning moves, such as simultaneous changes in translation speeds in the x and y directions of the positioning system 25 to follow a complex build pattern, will result in slight changes in the travel speed of the overall part due to inertia at starts and stops, and the need to slow down to turn corners. Uncorrected, this may lead to over and under building of the deposit at different geometric features within the deposited part.

Currently, the EBF³ process requires an operator to make manual adjustments and decisions on when to stop the process if a flaw is detected. However, the ultimate goal in establishing closed-loop control is to get the operator out of the loop, which not only enables process consistency, but also unattended operation. Another important element to the control loop this is flaw detection. As a minimum, the control loop must be capable of identifying when specific fatal flaws have occurred, such as a wire problems where the wire 18 either sticks into the molten pool 24, strays from the molten pool, begins to drip, jams in the wire feeder 16, or a spool of the wire feeder is emptied altogether so that the process can be automatically stopped for operator intervention. Several of these flaws can be avoided altogether or corrected in real time, such as those related to wire positioning, so that the EBF³ process can continue uninterrupted and not result in flaws in the final deposition.

To enable modification of the deposition parameters, first the relationship between the dependent and independent variables must be defined. The set of final control parameters 11F that controls the EBF³ process may include: a feed rate of the wire 18 from the wire feeder 16, a translation speed, and/or beam power, the latter being defined by beam current and accelerating voltage. In addition, fine-tuning can be achieved through controlling the following: beam focus, beam raster pattern, wire position, process height, (the distance between wire tip and deposit, i.e., the standoff distance), programmed shape, fill hatch pattern and spacing, and tilt on the gun 12 or a fabricated part.

Each of these final control parameters 11F is controllable by computer-inputs in the design data 19, and may be modified via the set of input parameters 11 from controller 22. For example, CAD data may be converted into a program code, e.g., "G-code" as understood in the art, which contains all of the input parameters to control the entire apparatus to build a desired part. The design data 19 defines the part geometry, and the program code contains all of the machine directions on where to move and at what speed, when to turn the electron beam gun 12 on and off, power settings to use, when to turn the wire feeder 16 on and off, wire feed speeds, etc. The entire part can also be externally heated or cooled through a heated/cooled platen, or through additional deflection of the beam 14 into certain regions to help even out the temperature within the substrate 20 and any deposited material.

Output Parameters:

The primary output parameters include: layer or bead height, bead width, bead shape, temperature of the baseplate or substrate 20 remote from the deposition area, temperature, depth, area, aspect ratio, etc. of the molten pool 24, and position of the wire 18 with respect to the molten pool 24. Any of these parameters may be monitored in real time to provide data for algorithm 100. Changing deposition input parameters may impact the microstructure and chemistry of any resulting deposits. These are not measurable in real time, and are directly related to the net thermal input into the EBF³ process. Therefore, selection of appropriate indicators, such as either the temperature or the molten pool size and shape, are critical for maintaining consistency throughout the deposition process.

Figure 3A:
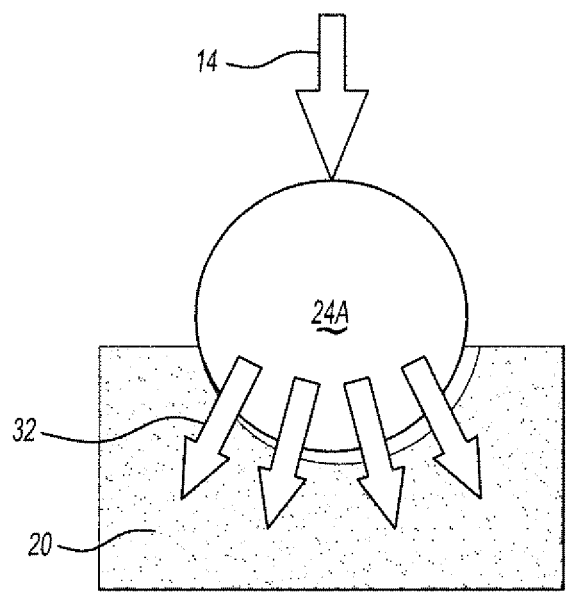
FIG. 3A is a schematic illustration of a single layer of a deposit formed using the apparatus shown FIG. 1.
Figure 3B:
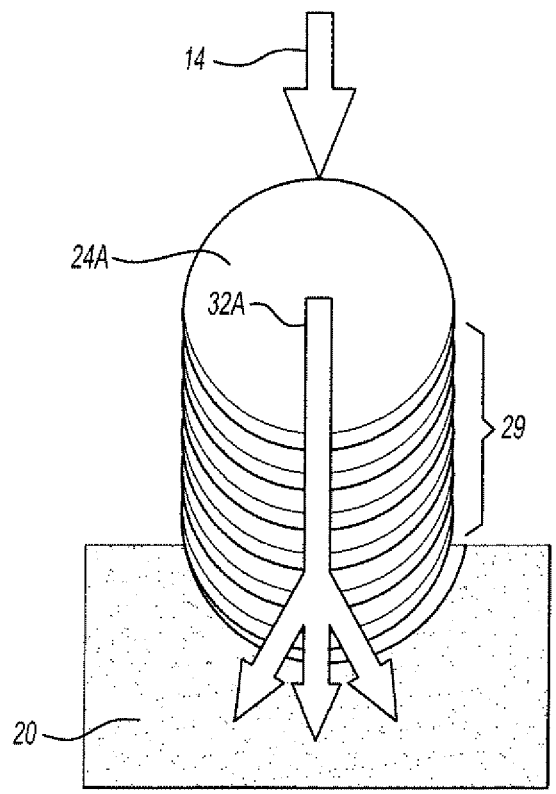
FIG. 3B is a schematic illustration of a molten pool and multiple layers of deposits formed using the apparatus shown in FIG. 1.

Independent/Dependent Variable Relationships:

The relationships between the independent and dependent variables during closed-loop control are largely related to the thermodynamics of the EBF³ process. Even if the final control parameters 11F are held constant from one layer to the next, the thermodynamics of the process is transient because the temperature in the substrate 20 and the cooling path is continuously changing, as shown in FIGS. 3A and 3B. That is, in FIG. 3A the molten pool 24A, which is shown schematically for clarity, has a conduction path 32 to the substrate 20. A higher initial cooling rate is provided due to lower initial temperature and a large cooling path through the substrate 20. In FIG. 3B, the cooling rate is lower due to a limited conduction path 32A through the various layers 29 of a prior build, i.e., the molten pool 24A cools in multiple layers. The conduction path 32A of FIG. 3B differs from the conduction path 32 of FIG. 3A, with an increasing temperature and width of the resultant molten pool 24 (also see FIG. 1).

Therefore, basic closed-loop process control is necessary to maintain the same conditions at the first layer and the last layer of a given deposit. In other words, the EBF³ process is transient, not steady-state, and therefore a closed control loop is used to account for the changing conditions. Information conveyed by sensor data 13 related to measurement of the molten pool 24 provides input into the thermal conditions of the EBF³ process. Primary input parameters for the EBF³ process define the conditions that are being used to deposit material; these input parameters generate and sustain the molten pool 24. The sensors 15 are then used to measure the molten pool 24 of FIG. 1. If the wire feed rate is increased, the mass flow rate of metal into the molten pool 24 increases, which changes the subdivision of energy required to melt the wire as compared to melting the substrate. This has the net effect of reducing the energy density in the molten pool 24 of FIG. 1. If the translation speed is increased, the incident energy is being exposed to more substrate area which has the effect of lowering the energy density in the molten pool 24.

Increasing the focus of the electron beam 14 serves to tighten the energy density of the electron beam. If the energy density is focused tightly, a keyhole will form which embeds energy from the beam 14 into the depth of the substrate 20, allowing bulk rather than surface heating. If the beam 14 is defocused, only surface heating will occur. Beam focus and rastering to locate beam 14 anywhere within the process region (arrow A of FIG. 1) is a powerful tool that can be used to control the energy density. An example of a beam rastering process that can be incorporated into the present invention is described and claimed in U.S. application Ser. No. 12/751,075, entitled "USE OF BEAM DEFLECTION TO CONTROL AN ELECTRON BEAM WIRE DEPOSITION PROCESS." Increasing the beam current or beam power will increase the energy density in the molten pool.

The energy density affects the entire $EBF^3$ process, including the molten pool 24, chemistry, bead geometry, etc. Thus, this is a very effective parameter to monitor and control. There are several different ways to control the energy density in coupled and decoupled variables, but interdependencies of the entire process make it difficult to control energy density without also changing several dependent variables.

Controlling the $EBF^3$ process through modifying the beam raster pattern offers one solution which enables rapid deflection of the beam to focus the energy into different regions. Since the beam can be rastered at a rate of approximately 10 kHz, and the response time of the molten pool 24 is on the order of 1 Hz, there is plenty of bandwidth to allow sub-partioning of the duty cycle of the beam 14 into different regions to assist with the control. This will provide a very high degree of control, enabling complex geometry builds with controlled microstructures, chemistries, and thermal residual stress distortion.

A simpler solution also contemplated is merely an adjustment on reducing the input power on the electron beam through reducing the current. This has the same effect of reducing the energy density and thus the thermal input, but is simpler to implement and control. For $EBF^3$ applications which will be manufacturing the same component day after day, this is adequate to maintain control on the process, as the geometry effects (such as reducing wire feed rate and beam power proportionally to the change in translation speed as the positioning system inertia dictates the translation accelerations and decelerations throughout the build layers) can be handled in the program for building the component in the first place.

Feedback Loop:

The feedback loop involves connecting the closed-loop control computer, e.g., the host machine 27, back to the $EBF^3$ command computer, e.g., the main process controller 30, which may be programmed and responsible for communicating with the positioning drives system 25, the wire feeder 16, and the electron beam gun 12. The feedback loop simply takes the output of algorithm 100 generated by the host machine 27 and commands the $EBF^3$ host machine to modify the appropriate set of control parameters 11F via the input parameters 11 to attain the desired closed loop control.

The following adjustments may be made to correct for changes occurring in real time during the $EBF^3$ process: (1) Adjust the z-axis height to maintain the proper distance between the wire feed and the deposit. This corrects for trenching from dragging the wire 18 through the molten pool 24 or the wire sticking into the molten pool 24 if the distance is too small, dripping of the wire into the molten pool 24 if the distance is too large, and for incorrectly programmed step height from one layer to the next. However, care must be taken to accurately measure the actual build height to ensure that the built part matches the solid model CAD part that provides the target geometry. Continued adjustment of the z-axis height without reference back to the CAD part can result in over- or under-sealing of the part in the z-axis direction resulting in inaccurate part fabrication; (2) Decrease beam power, e.g., by decreasing the beam current, as the number of layers increases. This corrects for the build-up in overall part temperature as the cooling path changes, as shown in FIGS. 3A and 3B.

While the best modes for carrying out the present invention have been described in detail, those familiar with the art to which this invention relates will recognize various alternative designs and embodiments for practicing the invention within the scope of the appended claims.

What is claimed as new and desired to be secured by Letters Patent of the United States is:

1. A closed-loop control method for an electron beam freeform fabrication ($EBF^3$) process wherein, using an $EBF^3$ apparatus, a wire is fed via a wire feeder, melted, and progressively deposited as a molten pool, the molten pool being cooled in layers on a substrate, the method comprising:

melting the wire via an electron beam within a vacuum chamber to thereby form the molten pool on the substrate;

detecting a feature of interest of the molten pool during the $EBF^3$ process using at least one sensor, wherein the feature of interest includes at least one of a height of the molten pool, a distance between the molten pool and the wire feeder, and a temperature of the layers;

continuously evaluating the feature of interest to determine, in real time, a change occurring therein; and using a host machine to automatically modify, in a closed-loop manner, a set of control parameters of a master process controller used to control an operation of the $EBF^3$ apparatus.

2. The method of claim 1, wherein the at least one sensor includes a camera, and wherein detecting a feature of interest additionally includes capturing an image of a location of the wire relative to the molten pool and a shape and area of the molten pool during the $EBF^3$ process using the camera.

3. The method of claim 1, wherein the apparatus includes an infrared (IR) band-pass filter, and wherein detecting a feature of interest includes using the IR band-pass filter to thermally image the layers.

4. The method of claim 1, wherein the at least one sensor comprises an electron detector, and wherein detecting a feature of interest comprises using the electron detector to image the $EBF^3$ process.

5. The method of claim 2, further comprising an electron detector, wherein detecting a feature of interest comprises using the electron detector to further image the $EBF^3$ process.

6. The method of claim 3, further comprising an electron detector, and wherein detecting a feature of interest comprises using the electron detector to further image the $EBF^3$ process.

7. The method of claim 1, wherein continuously evaluating the feature of interest to determine, in real time, a change occurring therein includes automatically assessing at least one of a magnitude and a speed change of a wire feed during the $EBF^3$ process.

8. The method of claim 1, wherein automatically modifying a set of input parameters includes automatically modifying one of: a position and a temperature of a component of the apparatus.

9. A closed-loop control method for an electron beam freeform fabrication (EBF$^3$) wherein, using an EBF$^3$ apparatus, a wire is melted via an electron beam in a vacuum chamber and progressively deposited as a molten pool, the molten pool being cooled in layers on a substrate, the method comprising:
collecting images of a feature of interest of the molten pool during the EBF$^3$ process using at least one camera positioned inside of the vacuum chamber;
continuously evaluating the images using a host machine to determine, in real time, a magnitude and a rate of change occurring in the feature of interest, including at least a height of the molten pool; and
automatically modifying a set of control parameters to the EBF$^3$ apparatus, via the host machine, in a closed-loop manner to thereby control the EBF$^3$ process.

10. The method of claim 9, wherein the camera is equipped with one of: a charge-coupled device and a complementary metal-oxide semiconductor.

11. The method of claim 9, wherein the camera is equipped with an infrared (IR) band-pass filter, and wherein collecting images of a feature of interest includes thermally imaging the EBF$^3$ process using the IR band-pass filter.

12. The method of claim 9, wherein collecting images of a feature of interest further comprises using an electron detector to further image the EBF$^3$ process from within the vacuum chamber.

13. The method of claim 11, further comprising an electron detector to further image the EBF$^3$ process from within the vacuum chamber.

14. The method of claim 9, wherein collecting images of a feature of interest comprises imaging at least one of: a size-related property of the wire, a position of the wire relative to the molten pool, a size-related property of the molten pool, a temperature of at least one of the layers, and a temperature of the molten pool.

15. An apparatus for providing closed-loop control method of an electron beam freeform fabrication (EBF$^3$) process, wherein a wire is melted via an electron beam and progressively deposited onto a substrate as a molten pool, and wherein the molten pool is cooled in layers on the substrate, the apparatus comprising:
a vacuum chamber;
an electron gun positioned in the vacuum chamber and adapted for generating the electron beam;
a wire feeder adapted for feeding the wire toward a substrate;
a main process controller adapted to control the electron gun and the wire feeder via a set of control parameters, wherein the wire is melted into a molten pool and progressively deposited in layers onto the substrate to form a product;
at least one sensor adapted for measuring a feature of interest of the molten pool during the EBF$^3$ process, wherein the feature of interest includes at least one of a height of the molten pool, a distance between the molten pool and the wire feeder, and a temperature of at least one of the layers; and
a host machine having an algorithm for continuously evaluating the feature of interest to determine, in real time, a change occurring therein;
wherein the host machine is configured to execute the algorithm and thereby automatically generate a set of input parameters that modifies the set of control parameters, thereby controlling the EBF$^3$ process in a closed-loop manner.

16. The apparatus of claim 15, wherein the at least one sensor includes a camera adapted for imaging the feature of interest.

17. The apparatus of claim 16, wherein the camera is equipped with one of: a charge-coupled device and a complementary metal-oxide semiconductor.

18. The apparatus of claim 16, wherein the camera is equipped with an infrared (IR) band-pass filter, and is adapted for thermally imaging the layers as they cool using the IR band-pass filter.

19. The apparatus of claim 16, wherein the at least one sensor further comprises an electron detector, wherein measuring a feature of interest comprises using the electron detector to further image the EBF$^3$ process.

20. The apparatus of claim 16, wherein the at least one sensor further comprises an electron detector, wherein measuring a feature of interest comprises using the electron detector to further image the EBF$^3$ process.

21. The apparatus of claim 15, wherein the at least one sensor comprises an electron detector adapted for measuring a feature of interest.

22. The apparatus of claim 15, wherein the sensors are further adapted for collecting images of the feature of interest by imaging: a size-related property of the wire, a position of the wire relative to the molten pool, a size-related property of the molten pool, and a temperature of the molten pool.

23. The apparatus of claim 15, wherein the set of input parameters includes: a feed rate of the wire, a translation speed of the wire, and a power value of the electron beam.

* * * * *

UNITED STATES PATENT AND TRADEMARK OFFICE
CERTIFICATE OF CORRECTION

PATENT NO.       : 8,452,073 B2  
APPLICATION NO.  : 12/750991  
DATED            : May 28, 2013  
INVENTOR(S)      : Taminger et al.

Page 1 of 1

It is certified that error appears in the above-identified patent and that said Letters Patent is hereby corrected as shown below:

Title Page, Item (75) Inventor is corrected to read:
-- Karen M. Taminger, Yorktown (VA);
   Robert A. Hafley, Yorktown (VA);
   Richard E. Martin, Yorktown (VA);
   William H. Hofmeister, Nashville (TN);
   William J. Seufzer, Yorktown (VA) --.

Signed and Sealed this
Ninth Day of June, 2015

Michelle K. Lee
*Director of the United States Patent and Trademark Office*